United States Patent [19]
Wendt

[11] Patent Number: 4,854,039
[45] Date of Patent: Aug. 8, 1989

[54] PROTOTYPE CIRCUIT BOARD AND METHOD OF TESTING

[75] Inventor: Barry M. Wendt, Maple Grove, Minn.

[73] Assignee: The Technology Congress, Ltd., Minnetonka, Minn.

[21] Appl. No.: 190,046

[22] Filed: May 4, 1988

[51] Int. Cl.⁴ .......................... H05K 3/30; H05K 5/00
[52] U.S. Cl. ...................................... 29/832; 29/833; 174/68.5; 324/158 F; 362/33; 434/379
[58] Field of Search .................... 29/832, 833; 362/33; 434/379; 324/158 F; 174/68.5

[56] References Cited

U.S. PATENT DOCUMENTS

| | | | |
|---|---|---|---|
| 3,466,762 | 9/1969 | Kirk et al. | 29/832 R |
| 3,639,746 | 2/1972 | Adams et al. | 240/2 R |
| 3,643,085 | 2/1972 | Durand | 240/20 |
| 3,748,455 | 7/1973 | Welton | 240/2 AT |
| 3,868,508 | 2/1975 | Lloyd | 358/106 X |
| 3,889,053 | 6/1975 | Lloyd et al. | 358/106 |
| 3,964,193 | 6/1976 | Degenhardt et al. | 40/106.1 |
| 4,071,883 | 1/1978 | Dennis | 362/97 |
| 4,404,619 | 9/1983 | Ferguson | 362/222 |
| 4,418,378 | 11/1983 | Johnson | 362/97 |
| 4,473,842 | 9/1984 | Suzuki et al. | 29/832 X |
| 4,556,903 | 12/1985 | Blitchington et al. | 358/106 |
| 4,564,886 | 1/1986 | Morcheles | 362/97 |
| 4,654,762 | 3/1987 | Laverick | 362/97 |
| 4,686,565 | 8/1987 | Ando | 358/101 |
| 4,700,225 | 10/1987 | Hara et al. | 358/106 |

FOREIGN PATENT DOCUMENTS

702550 12/1979 U.S.S.R. .................. 29/832

OTHER PUBLICATIONS

IBM Tech. Discl. Bull. vol. 20, No. 12, May 1978 by McPherson et al., pp. 5091–5092.

Primary Examiner—Timothy V. Eley
Assistant Examiner—Carl J. Arbes
Attorney, Agent, or Firm—Kinney & Lange

[57] ABSTRACT

A light table work station is provided for use in combination with a transparent prototype circuit board. At least a portion of each circuit trace on a circuit board is viewable when the board is populated with components, and back lit when the board is positioned on the work table, and each trace is also accessible from each side of the circuit board for examination, testing and/or modification. A work station is provided with a second upstanding light table for retaining transparent artwork sheets, each sheet bearing a copy of the circuit traces for each respective circuit plane on the circuit board.

15 Claims, 3 Drawing Sheets

PROTOTYPE CIRCUIT BOARD AND METHOD OF TESTING

BACKGROUND OF THE INVENTION

1. Field of the Invention

The present invention relates to an improved method for examining and modifying prototype circuit boards, and more specifically to the use of a light table for backlighting a circuit board of transparent dielectric material to permit viewing of the layered circuit traces on the circuit board.

2. Description of the Prior Art

The development of prototype circuit boards or "breadboards" has always been a time consuming and laborious process. Once a circuit concept has been schematically drawn, it is not in final form for a production-run circuit board. The arrangement of components and the circuit traces on the various layers or circuit planes of the circuit board still need to be laid out in an optimal manner to achieve the most efficient use of the circuit board geography, minimize possible interference among components and/or circuit traces on the circuit board, and to provide a circuit board layout which is logical and as easy as possible to follow should maintenance or modification be necessary. Thus, once a circuit schematic is prepared, there may be numerous board layout iterations before a final layout of the circuit board geography and its respective circuit planes is developed.

After the initial schematic is developed, the next usual step is to assemble a prototype circuit board in order to ascertain whether the circuit operates, to allow further testing and modification of the circuit itself, and ultimately to aid in laying out the circuit board geography and its circuit planes for circuit board production purposes. A prototype circuit board is often referred to as a "proto board," "brass board," or "wire wrap board." In each of these instances, a board medium is used which has embedded power and ground planes running therethrough, to allow components to simply be plugged in to the board and then wire wrap connected on the board (often using wire wrapping techniques). The final product in this case is a board with components populating one side and wires running to and fro on the other side. The advantage of this type of prototype circuit board is that the component mounting is temporary (not soldered) and modifications to the board can be made by rerouting the wires from component to component or to different component leads without scrapping the entire board. The boards used for such prototype arrangements are not printed circuit boards, except for the power and ground planes therein—all other circuitry is achieved by wire wrapping techniques.

In addition, because the power and ground planes are embedded in such prototype boards and the wire wrapping occurs typically on one side of the board, modification is sometimes difficult because the board must be turned over and back to ascertain what wire came from and went to a particular component or lead on a component. Tracing the circuit on a prototype wire wrap board is often difficult because the circuit schematic does not resemble the component layout on the board and if a component layout schematic has been developed, the necessity for looking at both sides of the board at the same time to determine where circuit traces start and end with respect to various components is difficult to do, laborious and easily subject to error.

For simple prototype circuits, wire wrapping boards are a quick and easy means for building a prototype circuit to allow testing and further modification. For more complex circuitry arrangements, however, a wire wrap board becomes quite complex and literally quite messy because of the wires running from component to component. In addition, because of the solderless connections and possible lengthy wires that might be needed between components, electrical performance of a prototype wire wrap board may be different from that intended by the design, or may differ from the final production board design (in final circuit board form, the components are typically arranged quite compactly with shorter circuit traces than in a prototype board for the same circuit). The need to be able to develop a prototype circuit board which is much closer to the final printed circuit board product has been long felt in the circuit board design industry.

SUMMARY OF THE INVENTION

The present invention provides an improved prototype circuit board arrangement, and method for use of this improved circuit board in examining, testing and modifying the circuit defined thereon. Instead of wire wrapping a prototype circuit board, the circuit to be tested is examined and laid out in a plurality of circuit planes to be defined by circuit traces on a printed circuit board. The printed circuit board bearing these traces is formed from a dielectric transparent or translucent material, whereby at least a part of each circuit trace is visible from both the first and second sides of the board, even when the board is populated by the desired circuit components on one of those sides. This is further made possible because the components on the board are removably mounted to the board by single inline sockets. For viewing the circuit traces in the transparent circuit board, the circuit board is placed on a top side of a translucent circuit board work surface and an illumination source is provided on a bottom side of the translucent circuit board work surface. Thus, all of the circuit planes of the circuit board are illuminated and viewable for tracing, testing or modifying the circuit.

Preferably, a layout of the circuit traces on each circuit plane is printed on a separate transparent sheet, exactly as those traces are formed on their respective circuit plane of the circuit board, and with each sheet having first and second opposite sides conforming to the first and second sides, respectively, of the circuit board. One of these sheets is placed, first side down, on a top side of a translucent circuit artwork surface adjacent the circuit board work surface, and an illumination source is provided on a bottom side of the translucent circuit artwork work surface. Thus, the circuit traces of the transparent sheet are illuminated for viewing from the second side of the sheet. Preferably, the transparent sheets of each of the circuit planes of the circuit board are overlaid on the circuit artwork work surface and the sheets are aligned to match the aligned relation of the interactive circuit planes of the circuit board. The relationships of the circuit traces on the circuit board are then visible both on the sheets on the circuit artwork work surface and on the circuit board itself on the circuit board work surface. This allows easy comparison and tracing on the artwork and corresponding adjacent circuit board for examination, testing and modification of the circuit.

Housing means are provided for supporting the circuit board work surface and circuit board artwork work surface so that the top sides thereof are disposed at an obtuse angle relative to one another, and for encasing and supporting the illumination sources for the bottom sides of the circuit board work surface and circuit board artwork work surface. The housing means further includes means for retaining tools used for testing and modifying the circuit board, and also can include means for retaining wires of varying length used for making wire wrap modifications to the circuit board.

DETAILED DESCRIPTION OF THE PREFERRED EMBODIMENTS

Figure 1:
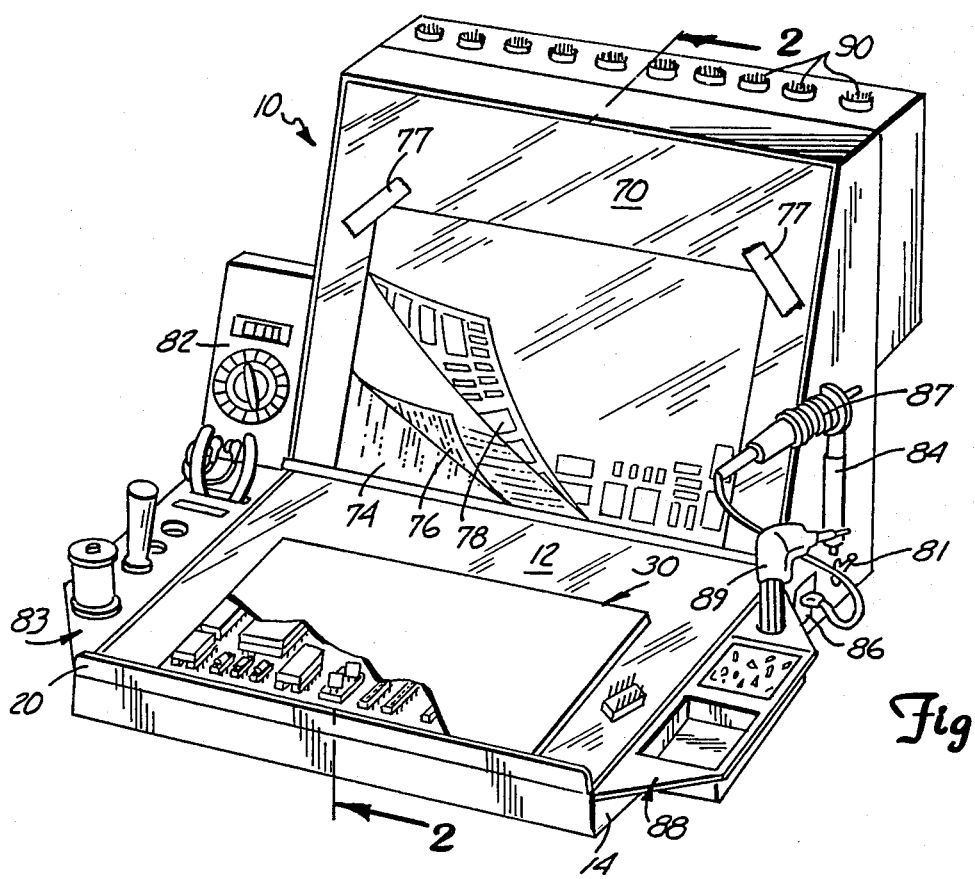
FIG. 1 is a perspective view of a prototype circuit board light cabinet work station of the present invention.
Figure 2:
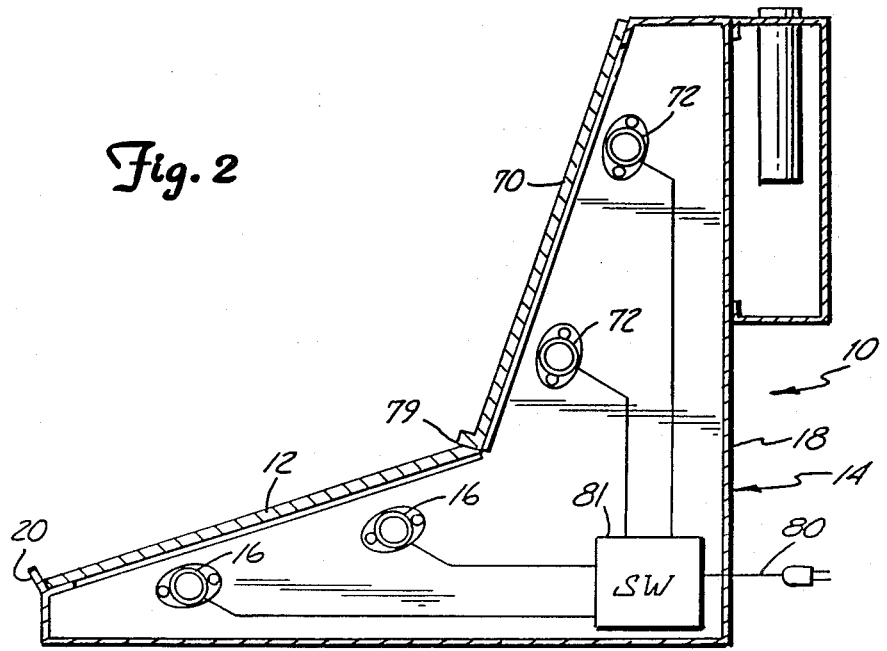
FIG. 2 is a sectional view as taken along the lines 2—2 in FIG. 1.

In FIG. 1, a work station 10 is shown for use in examining, testing and modifying a prototype circuit board. The work station 10 is essentially a light table, having one or more planar surfaces which are transparent or translucent and lighted from behind. Thus, when a circuit board is formed from transparent or translucent dielectric substrate and placed on the light table portion of the work station 10, the circuit tracings of the circuit board are readily visible for examination. The work station 10 has a planar circuit board work surface 12 which is transparent, or preferably translucent to allow light to pass therethrough and to disperse the light evenly (e.g., a milky white Plexiglas ® panel). This surface 12 is supported by a housing 14, in which circuit board illumination means (such as flourescent lights 16) is housed. As seen in FIGS. 1 and 2, the circuit board work surface 12 is sloped forwardly relative to the back side 18 of the housing 14 for operator convenience, and an upstanding rim 20 is provided at the lower front edge of the circuit board work surface 12 to prevent a circuit board thereon from sliding off the work surface 12.

Figure 3:
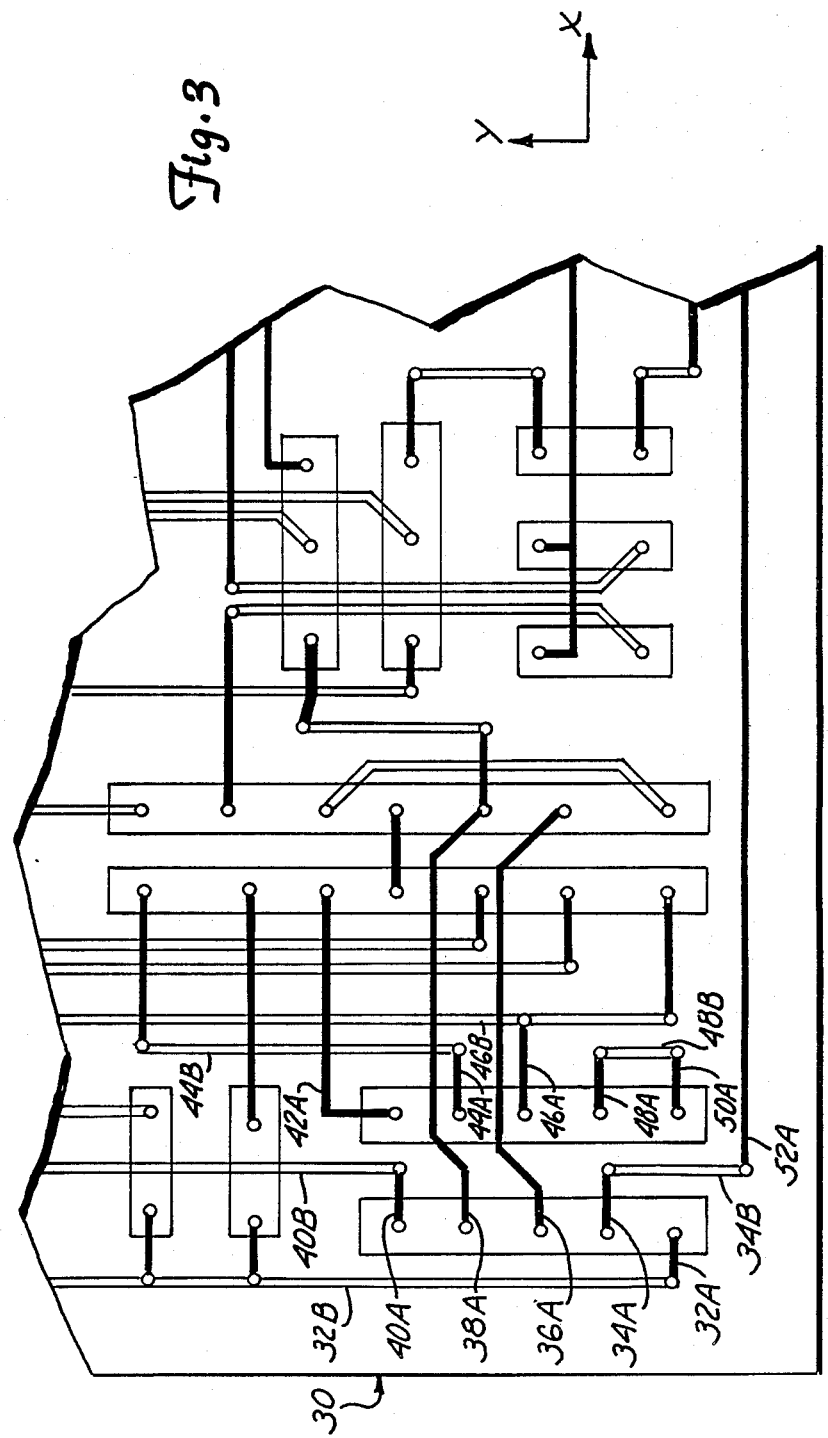
FIG. 3 is a top planar view of a portion of a prototype circuit board of the present invention.
Figure 4:
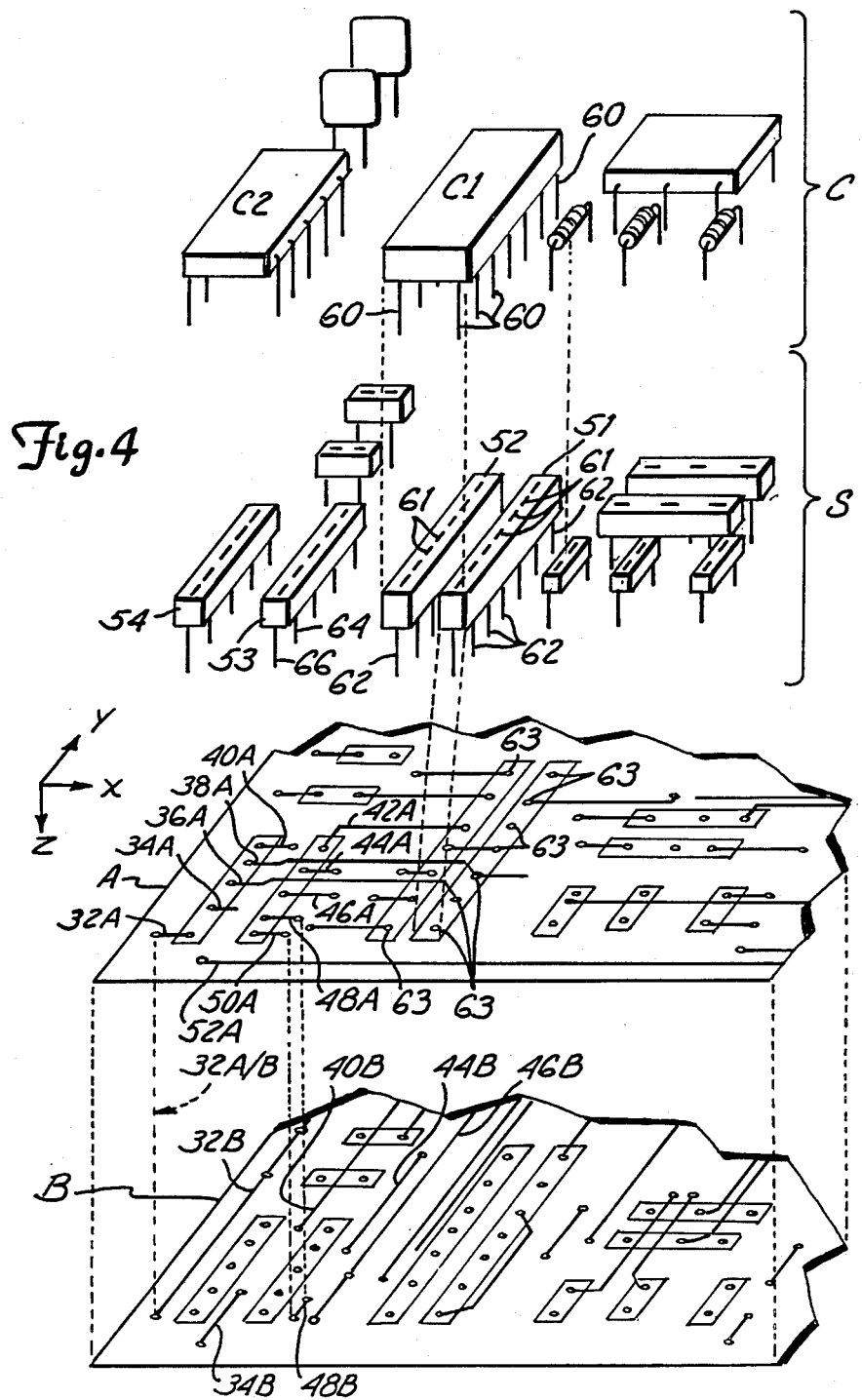
FIG. 4 is an exploded view showing the relationships of the components, sockets and circuit planes of the circuit board seen in FIG. 3.

An example of a prototype circuit board 30 for use in combination with the work station 10 is seen (in part) in FIGS. 3 and 4. Circuit board 30 is formed from a dialectric substrate which is transparent, or translucent (such as fiberglass). The board 30 is in the form of a board or panel, having a relatively thin thickness or z dimension in comparison to its length and width, or x and y dimensions, respectively. In its z or thickness dimension, the circuit board 30 is formed from a plurality of circuit planes, with each plane being defined by a plurality of circuit traces. In FIG. 4, it is seen that the board of FIG. 3 is formed from two circuit planes--circuit plane A and circuit plane B. As many circuit planes as possible may be provided in the prototype circuit board of the present invention, in order to effectuate the desired circuit design. Each circuit plane is defined by a plurality of circuit traces which are formed in the usual printed circuit board manner (e.g., printed, etched, etc.) on the dielectric substrate of the circuit board. As seen in FIG. 4, the circuit traces of circuit plane A all run generally lengthwise relative to the circuit board, or along its x dimension. Conversely, the circuit traces of circuit plane B run along the width of the circuit board, or in its y dimension. When the circuit planes A and B are assembled to define the circuit board 30, the dielectric substrate of the circuit board separates the circuit planes sufficiently to insulate the circuit traces of the circuit planes A and B which otherwise might electrically intersect. For example, circuit traces 32A-52A on circuit plane A all extend generally in the x dimension, while circuit traces 32B, 34B, 40B, 44B, 46B and 48B on circuit plane B all extend generally in the y dimension. When the planes A and B are assembled to define circuit board 30, the dialectric substrate of the circuit board insulates the traces across the z dimension (the traces of plane A cross over the traces of plane B, as viewed in FIG. 3). The circuit traces of plane A and the circuit traces of plane B are selectively electrically connected by vertical traces extending between the planes as desired, as indicated for example in phantom by vertical trace 32A/B in FIG. 4.

In this discussion, it should be understood that the circuit illustrated in FIGS. 3 and 4 is merely exemplary of a circuit design laid out on a prototype circuit board of the present invention. As is typical, the components which populate the circuit board 30 (and which are indicated generally at C in FIG. 4) are each provided with a plurality of downwardly extending connector pins designed to be inserted into correspondingly aligned terminal points on a circuit board. However, in the prototype circuit board of the present invention, single inline package (SIP) sockets (which are indicated generally at S in FIG. 4) are provided between the components and the circuit board. Each SIP, such as SIP S1, also has a plurality of downwardly extending connector pins designed to be inserted into correspondingly aligned terminal points on the circuit board 30. The SIP S1 and its adjacent matching SIP S2 are designed for use in connection with component C1, which is a dual inline package (DIP) component. The sockets S1 and S2 are provided with sufficient terminal points or holes therein for accepting and retaining the connector pins of the component C-1, both mechanically and electrically in typical SIP fashion.

Each terminal point (or "land") n the circuit board 30 includes a hole in the substrate which is rimmed with electrically conductive material and is connected to one or more circuit traces on the circuit board 30. For example, DIP component C1 has fourteen pins 60, and the SIP sockets S1 and S2 have fourteen pin receptacles 61 designed to accept the pins 60 and thereby both mechanically and electrically position the component C1 relative to the SIP sockets S1 and S2. Similarly, each of the SIP sockets S1 and S2 has seven pins 62, and the circuit board 30 has fourteen holes 63 designed to accept the pins 62 and thereby both mechanically and electrically position the SIP sockets S1 and S2 on the circuit board 30. The holes 63 extend completely through the substrate of the board 30, and provide means for electrically connecting the pins 62 of the SIP sockets S1 and S2 (and those of component C1) with their respective circuit traces (such as circuit traces 36A, 38A and 42A). The components C are simply pushed into place on a top side of the SIP sockets S, which are in turn pushed into place on the circuit board 30, or the SIP sockets S may be soldered in place on the board. The pins 62 from the SIP sockets S extend out from the bottom side of the board 30, a distance sufficient to permit wire wrap connections to the pins 62 if desired.

The ground and power planes of a typical prototype circuit board have been eliminated in the circuit board of the present invention. The ground and power circuit traces of the prototype circuit are designed directly into the circuit traces of the prototype circuit board in grid fashion within the board's substrate. This not only allows for a more compact and efficient prototype circuit board design, but makes useful the fact that the dielectric substrate of the circuit board is transparent, since the power and ground planes would otherwise interfere with the visibility of the circuit traces on the circuit board. The elimination of the power and ground planes also means that fewer circuit planes (such as circuit planes A and B) may be needed in a particular circuit board design.

In designing the prototype circuit board 30 of the present invention, the circuit tracings of each circuit plane are laid out to minimize trace lengths and also to avoid trace interference. More importantly, however, at least a portion of each circuit trace (or combination of traces in different planes) is made visible and accessible from either side of the circuit board 30. This is made possible by a careful layout of the circuit traces relative to each of the components C and the fact that the components are removably mounted in SIP sockets. Thus, no circuit trace is completely hidden under the components and thus inaccessible. An example of this is seen in the circuitry of circuit traces 48A and 50A on circuit plane A and circuit trace 48B on circuit plane B, which together serve to connect conductive pins 64 and 66 of SIP socket 53, which in combination with SIP socket S4 supports DIP component C2. DIP component C2 can be simply pulled out of its SIP sockets S3 and S4 to permit access to the circuit connection between SIP socket 53 pins 64 and 66, which can then be examined, tested, broken or tapped, as desired. This feature is especially useful in developing prototype circuit boards, since it allows easy modification of the circuit on the board. Such modification is further made possible because the substrate of the circuit board 30 is transparent and the circuit traces therein can be viewed when the board is mounted on the illuminated circuit board work surface 12 of the work station 10. The use of SIP sockets for component mounting allows additional circuit modification advantages, since components can be easily replaced, or wire wrapping techniques used to run wires from the pin receptacles of the SIP sockets when the component pins have been removed therefrom.

In order to further enhance the ability to track, examine and modify the circuitry on the prototype circuit board 30, the work station 10 is provided with a circuit artwork work surface 70. The artwork work surface 70 is formed from a transparent or translucent material (such as a milky white Plexiglas ® panel) and is supported by the housing 14 with its top side disposed at an obtuse angle relative to the top side of the circuit board work surface 12, as seen in FIGS. 1 and 2. Illumination means (such as flourescent lights 72) is provided within the housing 14 and behind the artwork work surface 70 to provide a backlighting for that surface 70, similarly to the backlighting provided for the work surface 12.

For each circuit plane of the circuit board 30, a transparent or translucent sheet is provided with the circuit traces of its respective plane printed thereon. This allows the circuitry of each plane to be viewed separately, or the sheets may be overlaid and aligned for simultaneous viewing of one or more circuit plane traces. Preferably, each sheet is clear flexible plastic or Mylar and has the circuit traces printed thereon in black or in other contrasting colors.

On a typical printed circuit board, the circuit layout is silkscreened, in outline form, on the top of the board to allow visualization of the circuit layout and as an aid in assembly of the board. In order to eliminate the silkscreened outlines of the circuit components on the prototype circuit board of the present invention, and thus further enhance its see-through nature and to eliminate further obstructions to viewing the circuit traces thereon, the circuit board 30 does not have the component outline printed thereon. Because circuit designers are used to this feature, however, another sheet of transparent or translucent plastic is provided which has the component outline printed thereon. Again, this sheet may be viewed separately or may be overlaid and aligned with the sheets bearing the circuit traces in order to examine the circuitry of the circuit board 30.

In FIG. 1, a pair of circuit artwork sheets 74 and 76 (each partially showing the circuit trace designs of its respective circuit plane) are seen as mounted on the circuit artwork work surface 70 by masking tape 77 or other suitable means. In addition, a circuit layout sheet 78 is also shown in FIG. 1, laid over the circuit artwork sheets 74 and 76 on the circuit artwork work surface 70.

A rim 79 is also provided along the lower edge of the artwork work surface 70 to hold and align the artwork layout sheets. The illumination means 16 and 72 are powered by a suitable power source, such as household current via power cord 80, and may be switchable to on and off states via switch 81. In a preferred embodiment, each circuit artwork or layout sheet is printed in a full size relation with respect to its respective circuit plane, so that the artwork and circuit board are the same size and may be more easily compared while mounted on their respective work surfaces 70 and 12 of the work station 10.

As seen in FIG. 1, the work station 10 is provided with various holders for retaining tools, test equipment and other materials used for examining, testing and modifying the circuit board 30. For example, a stand is provided on one side of the housing 14 for holding a volt-ohm meter 82 to enable continuity checks of the circuitry, etc. A tool tray 83 is also mounted on the frame 14 to hold hand tools such as wire cutters, needle-nose pliers, wire formers, screwdrivers, and other necessary materials (such as solder rolls) for prototype circuit board modifications. On the side, the frame 14 has a holder 84 for a soldering iron 87, as well as built-in electrical accessory outlets 86 for the soldering iron 87, as well as additional trays 88 for holding hand tools, sponges, etc. and a special holder for a wire wrap tool 89. Further, a plurality of holders 90 is provided for extra wire wrap wires of differing lengths (preferably prestripped wires from one-half to twelve inches lengths).

The work station 10 provides a unitary and complete work station for examining the circuitry-viewable circuit board of the present invention and for providing the tools necessary for testing and modifying the circuitry on the circuit board. In addition, the artwork of the circuit board may be easily examined at the same time, plane-by-plane, via the circuitry artwork sheets and back lit work station. The work station 10 lights both the circuit board circuitry and the circuit artwork to make visible the circuit traces of the circuit.

The present invention thus presents an arrangement for creating and using a prototype circuit board which has a see-through substrate that allows accessibility and viewing of at least a part of each circuit trace embedded in the circuit board. This permits, through use of a light table work station, easy modification of the prototype circuit board. In addition, since the prototype circuit is laid out on a printed circuit board, the circuit board itself will more closely react electrically to that of the final production circuit board for the circuit, should that be of concern. In addition, the design of the work station permits storage and ready access of all tools and equipment needed to examine the circuitry, test it and try out any desired modifications. It is believed that the present invention represents a substantial improvement in the field of prototype circuit board design and use.

Although the present invention has been described with reference to preferred embodiments, workers skilled in the art will recognize that changes may be made in form and detail without departing from the spirit and scope of the invention.

What is claimed is:

1. A method for examining the circuitry of a printed circuit board having a plurality of parallel, interactive circuit planes thereon, the method comprising the steps of:

forming a printed circuit board from transparent material so that each circuit plane thereon is viewable from a first or second opposite side of the circuit board;

placing the circuit board, first side down, on a top side of a translucent circuit board work surface; and providing an illumination source on a bottom side of the translucent circuit board work surface whereby all of the circuit planes of the circuit board are illuminated and viewable from the second side of the circuit board.

2. The method of claim 1 wherein each circuit plane includes a plurality of circuit traces, and further comprising the step of:

defining each circuit trace to be at least partially viewable and accessible from the first or second side of the circuit board after the circuit board has been populated with circuit components on the second side thereof.

3. The method of claim 2, and further comprising the step of:

removably mounting each of the circuit components, including any dual inline package components, into single inline package sockets which are mounted on the second side of the circuit board in electrical connection with the circuit traces thereof to form the desired circuitry of the circuit board.

4. The method of claim 1 wherein the printed circuit board is formed from a translucent material.

5. The method of claim 1 wherein each circuit plane includes a plurality of circuit traces, and further comprising the steps of:

printing a layout of the circuit traces on each circuit plane of the circuit board on a transparent sheet, exactly as those traces are formed on their respective circuit planes of the circuit board with the sheet having first and second opposite sides conforming to the first and second sides, respectively, of the circuit board;

placing one of those sheets, first side down, on a top side of a translucent circuit artwork work surface adjacent the circuit board work surface; and providing an illumination source on a bottom side of the translucent circuit artwork work surface whereby the circuit traces of the transparent sheet are illuminated for viewing from the second side of the sheet.

6. The method of claim 5, and further comprising the steps of:

overlaying the transparent sheets of each of the circuit planes on the circuit artwork work surface; and aligning the sheets to match the aligned relation of the interactive circuit planes of the circuit board so that the relationships of the circuit traces on the circuit board are visible both on the sheets on the circuit art work surface and on the circuit board on the circuit board work surface.

7. The method of claim 5 wherein the layout of circuit traces on each sheet is a full size reproduction of its respective circuit plane on the circuit board.

8. The method of claim 5 wherein the top side of the circuit board work surface and the top side of the circuit artwork work surface are disposed at an obtuse angle relative to one another.

9. A circuit board for use in developing prototype circuit designs and permitting modifications thereto comprises a dielectric substrate having a plurality of parallel circuit planes defined thereon, each circuit plane, defined by a plurality of conductive circuit traces with selected traces between circuit planes being electrically connected, the dielectric substrate being transparent and each of the circuit traces being formed to be at least partially visible and thus accessible from one side of the circuit board after a circuit plane located furthest from the substrate has been populated with circuit components.

10. A prototype circuit board examination, tester and modification system comprising:

a prototype circuit board formed from a transparent dielectric substrate bearing a plurality of parallel circuit planes, each plane having a plurality of circuit traces thereon, and the board bearing a plurality of circuit components on one side thereof;

a transparent circuit board work surface for supporting, on a top side thereof, the circuit board; and means for illuminating a bottom side of the transparent circuit board work surface so that when viewed from the top side of the circuit board work surface the circuit traces of the circuit board are back lit and visible for examination, testing or modification.

11. The invention of claim 10 wherein each circuit trace of the circuit board is defined to be at least partially visible and accessible after the circuit board has been populated with circuit components.

12. The invention of claim 10, and further comprising:

a plurality of transparent sheets, one for each circuit plane of the circuit board, with each sheet bearing a printed layout of the circuit traces of its respective circuit plane;

a transparent circuit artwork work surface for supporting, on a top side thereof, one or more of the transparent sheets; and means for illuminating a bottom side of the transparent circuit artwork work surface so that when viewed from the top side of the circuit artwork work surface, the circuit traces on the transparent sheets are readily visible.

13. The invention of claim 12, and further comprising:
    housing means for supporting the circuit board work surface and circuit artwork work surface so that the top sides thereof are disposed at an obtuse angle relative to one another, and for encasing and supporting the illumination means for the bottom sides of the circuit board and circuit artwork work surfaces.

14. The invention of claim 13 wherein the housing means includes means for retaining one or more tools used for testing and modifying the circuit board.

15. The invention of claim 13 wherein the housing means includes means for retaining wires of varying length used for wire wrap modifications to the circuit board.

* * * * *

UNITED STATES PATENT AND TRADEMARK OFFICE
CERTIFICATE OF CORRECTION

PATENT NO. : 4,854,039

DATED : August 8, 1989

INVENTOR(S) : Barry M. Wendt

It is certified that error appears in the above-identified patent and that said Letters Patent is hereby corrected as shown below:

Column 8, line 50, after "surface", insert --,--.

Signed and Sealed this

Fifth Day of June, 1990

Attest:

HARRY F. MANBECK, JR.

Attesting Officer

Commissioner of Patents and Trademarks